United States Patent
Kajiwara et al.

(10) Patent No.: US 7,608,917 B2
(45) Date of Patent: Oct. 27, 2009

(54) POWER SEMICONDUCTOR MODULE

(75) Inventors: Ryoichi Kajiwara, Hitachi (JP); Kazuhiro Suzuki, Mito (JP); Toshiaki Ishii, Hitachi (JP); Kazutoshi Itou, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 221 days.

(21) Appl. No.: 11/749,211

(22) Filed: May 16, 2007

(65) Prior Publication Data

US 2007/0267739 A1 Nov. 22, 2007

(30) Foreign Application Priority Data

May 17, 2006 (JP) .............. 2006-137219

(51) Int. Cl.
*H01L 23/02* (2006.01)
*H01L 23/10* (2006.01)

(52) U.S. Cl. ............ 257/678; 257/703; 257/705; 257/706; 257/707; 257/712; 257/713; 257/E23.09; 257/E23.038; 257/E23.101

(58) Field of Classification Search ......... 257/666–733, 257/774–796, E23.001–E23.194
See application file for complete search history.

(56) References Cited

U.S. PATENT DOCUMENTS

| | | | |
|---|---|---|---|
| 6,201,696 B1 * | 3/2001 | Shimizu et al. | 361/704 |
| 6,605,868 B2 * | 8/2003 | Ishiwata et al. | 257/703 |
| 6,787,900 B2 * | 9/2004 | Shinohara et al. | 257/718 |

FOREIGN PATENT DOCUMENTS

| | | |
|---|---|---|
| JP | 10-056131 | 2/1998 |
| JP | 2004-247383 | 9/2004 |
| JP | 2005-123233 | 5/2005 |

* cited by examiner

*Primary Examiner*—Jasmine J Clark
(74) *Attorney, Agent, or Firm*—Antonelli, Terry, Stout & Kraus, LLP.

(57) ABSTRACT

A power semiconductor module and an inverter apparatus in which a device or a joining part is not mechanically damaged even when the temperature in use becomes a high temperature in the range of 175 to 250° C., resulting in excellent reliability at high temperature retaining test and thermal cycling test. Low thermal expansion ceramic substrates are disposed above and below the device. A material having a coefficient of thermal expansion of 10 ppm/K or less is disposed between the ceramic substrates. In addition, an inorganic material having a coefficient of thermal expansion in the range of 2 to 6 ppm/K or less is disposed around the device.

15 Claims, 4 Drawing Sheets

SECTIONAL VIEW OF
1-IN-1 TYPE MODULE

PERSPECTIVE VIEW
OF BOTTOM FACE
PATTERN OF UPPER
SUBSTRATE

TOP VIEW OF
MODULE WHEN
UPPER SUBSTRATE
IS REMOVED

TOP VIEW OF
LOWER SUBSTRATE

SECTIONAL VIEW OF MODULE

TOP VIEW OF MODULE

POWER SEMICONDUCTOR MODULE

BACKGROUND OF THE INVENTION

The present invention relates to a large current control semiconductor device used in high temperature environments represented by use in automobiles. In particular, the present invention relates to a power semiconductor module that is excellent in heat resistance of its junction and constituent materials and excellent in thermal fatigue life against the thermal cycling test or the power cycling test caused by the on/off of the device, even in the case where operation is conducted with the junction temperature of the semiconductor device in the range of 175 to 250° C.

Power semiconductor modules including power devices, such as MOSFETs and IGBTs, for exercising switching control on a large current and diodes for releasing the reverse voltage generated at the time of switching are used in wide fields ranging from household electric appliances to vehicles as main components of inverter apparatuses for power converter. In recent years, motor control in the automobile field is promoted rapidly. As a result, the environment in which the power semiconductor module serving as its current control device is used becomes severe. For example, the power semiconductor module is installed in a place in a high temperature atmosphere where cooling cannot be conducted sufficiently, or the controlled current capacity tends to increase. As the performance of the power semiconductor module, therefore, high reliability that normal operation can be ensured in a use environment having a large temperature change over a long period and a high heat resistance capable of withstanding a high temperature caused in the device by an increase of heat generated by elements when a large current flows are demanded.

A structure known as a conventional power semiconductor structure is obtained by joining a conductor plate onto an insulating substrate with, for example, solder, joining a Ni/Au-plated back electrode of a power device to the conductor plate with Pb-free solder, joining a conductor lead for main electrode to a main electrode on a circuit face with an Al or Au bump, connecting a conductor lead for control electrode to a control electrode with an Al or Au wire, and sealing the power semiconductor module with a mold resin obtained by filling an epoxy resin with a silica filling material by means of the transfer mold method, in a state in which a bottom face of the insulating plate is exposed (JP-A-2004-247383). Cooling of the power semiconductor module is conducted by a cooling substance disposed under the insulating substrate.

Another known structure is obtained by providing a power device having a main electrode on one main face and having a main electrode and a control electrode on the other main face, providing two high thermal conductive insulating substrates so as to have the power device between and have electrode electrodes on sandwiching faces to join to the electrodes of the power device, joining the electrodes of the power device to the electrodes on the high thermal conductive insulating substrates with brazing, providing terminals for external wiring connection so as to extend to the outside in parallel to faces of the high thermal conductive insulating substrates, and filling a gap between the two high thermal conductive insulating substrates with an insulating resin (JP-A-10-56131). A structure obtained by providing convex parts on the high thermal conductive insulating substrates and joining tips of the convex parts to the other high thermal conductive insulating substrate is also disclosed. Cooling of the power semiconductor module is conducted by cooling substances disposed above and below the upper and lower high thermal conductive insulating substrates.

SUMMARY OF THE INVENTION

In the structure obtained by disposing an insulating substrate having an electrode formed thereon on the underside, mounting a power device on the insulating substrate, joining a conductor lead to an electrode of a main circuit on a top face of the power device, and sealing the other side of the conductor lead with a mold resin, the heat radiating path used when the power device has generated heat is biased to the underside. Therefore, the temperature distribution in the power semiconductor module becomes vertically asymmetric. In addition, it is difficult to make coefficients of thermal expansion of the materials above and below the device equal to each other. In the stationary state in which the temperature is stable or the transient state, therefore, warp deformation occurs in the power semiconductor module and thermal stress occurs in the joining part between the device and the conductor plate. The thermal stress occurs repeatedly at the time of operation of the power device, resulting in a problem of fracture of the joining part caused by thermal fatigue. If warp deformation occurs, close adhesion between the insulating plate and the cooling substance is worsened and the cooling performance is lowered, resulting in a problem of a device damage or device characteristics degradation caused by the raised power device temperature.

On the other hand, in the power semiconductor module obtained by disposing the insulating substrates with printed circuit so as to have the power device between and joining the electrodes above and below the power device to the electrodes on the insulating substrates with printed circuit with brazing, it becomes possible to use the same material having a low coefficient of thermal expansion as the upper and lower materials and the temperature distribution can be made vertically symmetric because of the structure cooled from both upper and lower faces. As a result, warp deformation is not caused in the power semiconductor module. Therefore, it is possible to hold down the thermal stress generated in the joining parts between the device and the electrodes on ceramic substrate with printed circuit to a small value and prevent fracture from being caused by thermal fatigue in the joining parts. When filling the gap between the insulating substrates with printed circuit with an insulating resin, however, there are only materials of the resin that are greater in coefficient of thermal expansion than the power device. If the temperature of the power semiconductor module becomes a high temperature in the range of 175 to 250° C. higher than 150° C. which is the setting temperature of the resin, then force that widens the insulating substrates vertically is generated by expansion of the resin, resulting in a problem of fracture of the joining part caused by great tensile strength generated in the joining parts between the power device and the upper and lower electrodes on ceramic substrate with printed circuit. This is caused by the fact that the area where the resin acts to push up the insulating substrate with printed circuit is far larger than the area where the insulating substrate with printed circuit is supported, i.e., the joining area of the device. In the structure obtained by disposing the cooling substances above and below the power semiconductor module for the purpose of both side cooling and pushing the cooling substances against the upper and lower high thermal conductive insulating substrates to ensure the cooling performance, the material that supports the pushing pressure at the time of low temperature becomes only the power device and strain concentrates thereon, resulting in a problem that the circuit face side of the power device having a small joining area is susceptible to mechanical damage. At a use temperature of the power semiconductor module near 250° C., heat resistance of the resin is not obtained. Therefore, a structure obtained by filling the gap between the insulating substrates with printed circuit with an insulating coolant is conceivable. In this case, especially the problem of the pushing pressure applied to the device becomes remarkable. If the pushing pressure is made low, then mechanical damage can be prevented, but another problem that the cooling performance remarkably falls is posed.

A first object of the present invention is to provide a power semiconductor module having a power device joined to and mounted on an insulating substrate with printed circuit, capable of preventing warp deformation of the power semiconductor module even when the use temperature of the power semiconductor module becomes a high temperature in the range of 175 to 250° C., reducing thermal strain generated in the joining part of the power device, improving the thermal fatigue life remarkably, ensuring close adhesion between the insulating substrate with printed circuit and the cooling substance, and maintaining high cooling performance.

A second object of the present invention is to provide a power semiconductor module formed by interposing a power device between insulating substrates with printed circuit and joining electrodes of the power device to electrodes on ceramic substrate with printed circuit, that reduces thermal strain in a tensile direction applied to the joining parts of the power device, reduces pushing pressure applied to the power device by pressing force of the cooling substances, and that is highly reliable, even when the use temperature of the power semiconductor module becomes a high temperature in the range of 175 to 250° C.

In order to achieve the first object, a power semiconductor module includes a power semiconductor device having a main electrode and a control electrode formed on a circuit face and a rear electrode formed on a face opposite to the circuit face; a ceramic substrate with printed circuit having metal electrodes formed on both faces of a ceramic substrate, the metal electrode being joined to the rear electrode of the power semiconductor device; a lead having metal electrodes formed on both faces of a ceramic substrate, the metal electrode being joined to the main electrode and the control electrode of the power semiconductor device; and a mold resin having a coefficient of thermal expansion of 10 ppm/K or less for sealing the ceramic substrate with printed circuit, the power semiconductor device and the lead so as to expose metal electrodes on a side of the ceramic substrate with printed circuit that is not joined to the power semiconductor device and metal electrodes on a side of the lead that is not joined to the power semiconductor device to outside. Furthermore, the power semiconductor module includes a low thermal expansion ceramic substrate that is buried in the mold resin or adhered onto the mold resin.

Since the ceramic substrate with printed circuit has a configuration similar to that of the lead and a gap between them is sealed with a mold resin having a coefficient of thermal expansion of 10 ppm/K or less, warp deformation can be suppressed even if the temperature at the module has become high. Furthermore, since the low thermal expansion ceramic substrate is disposed on the opposite side of the ceramic substrate with printed circuit, the material configuration in the vertical structure of the power semiconductor module can be made substantially symmetrical vertically with respect to the coefficient of thermal expansion. Even if the temperature at the module becomes high, generation of warp deformation can be suppressed and the joining part of the power semiconductor device can be prevented from being fractured by thermal fatigue. Furthermore, a gap from the cooling substance is not generated, and the cooling performance can be kept high over a wide temperature region.

In order to achieve the second object, a power semiconductor module includes a ceramic substrate with printed circuit having metal electrodes of a good conductor formed on both faces of a low thermal expansion of ceramic substrate; at least one power semiconductor device; an insulating inorganic material having a coefficient of thermal expansion in a range of 2 to 6 ppm/K; and an insulating resin material having a coefficient of thermal expansion of 10 ppm/K or less. The ceramic substrate with printed circuit is disposed on each of above and below the device. Electrodes located above and below the device are joined to the upper and lower metal electrodes on ceramic substrates with printed circuit with an alloy phase having a temperature at solidus line of at least 260° C. and a yield strength that is higher than that of the material of the metal electrodes on ceramic substrates with printed circuit. The inorganic material is disposed around the device. And a space between the ceramic substrates with printed circuit is filled with the resin material.

In addition, the inorganic material is joined to the upper and lower ceramic substrates with printed circuit with an alloy layer similar to the joining material of the device.

Between the ceramic substrates with printed circuit, an insulating inorganic material having a coefficient of thermal expansion equivalent to that of the device is disposed besides the power semiconductor device. Therefore, the space filled with resin when filling the space between the ceramic substrates with printed circuit with the resin becomes small. When the temperature of the power semiconductor module has become high, therefore, force pushing up the ceramic substrate with printed circuit because of expansion of the resin is weakened. As a result, the joining part of the device is prevented from being fractured. On the other hand, when the temperature at the power semiconductor module has become low, pushing pressure exerted from the external cooling substances is supported by the inorganic material. Therefore, the pressure is dispersed and the possibility that the device will be damaged can be reduced.

In addition, in the structure in which the inorganic material is joined to the upper and lower ceramic substrates with printed circuit, the joining part of the device and the joining part of the inorganic material take partial charge of the force pushing up the ceramic substrate with printed circuit when the resin is expanded. As a result, the tensile strain applied to each joining part becomes small and it becomes possible to prevent joining parts from being fractured.

According to the present invention, the low thermal expansion ceramic substrates are disposed above and blow the power semiconductor device and a low thermal expansion material having a coefficient of thermal expansion of 10 ppm/K or less is disposed between the substrates. Even when the temperature at the power semiconductor module in use has become a high temperature in the range of 175 to 250° C., therefore, warp deformation of the power semiconductor module having a power device joined to and mounted on the ceramic substrate with printed circuit is prevented. It is thus possible to provide a power semiconductor module capable of remarkably improving the thermal fatigue life by reducing the thermal strain generated in the joining part of the power device, and capable of maintaining high cooling performance by ensuring close adhesion between the ceramic substrate with printed circuits and the cooling substances.

In addition, an inorganic material having a coefficient of thermal expansion in the range of 2 to 6 ppm/K is disposed around the device. As for a power semiconductor module obtained by interposing the power semiconductor device between the ceramic substrates with printed circuit and joining the electrode of the power device to the electrodes on ceramic substrate with printed circuit, therefore, it is possible to provide a highly reliable power semiconductor module in which the thermal strain in the tensile direction applied to the joining part of the power device is reduced even when the temperature at the power semiconductor module in use has become a high temperature in the range of 170 to 250° C. and the pushing pressure generated onto the power device by the cooling substance is reduced.

Other objects, features and advantages of the invention will become apparent from the following description of the embodiments of the invention taken in conjunction with the accompanying drawings.

DESCRIPTION OF THE EMBODIMENTS

Hereafter, embodiments of the present invention will be described in detail with reference to the drawings.

Figure 1A:
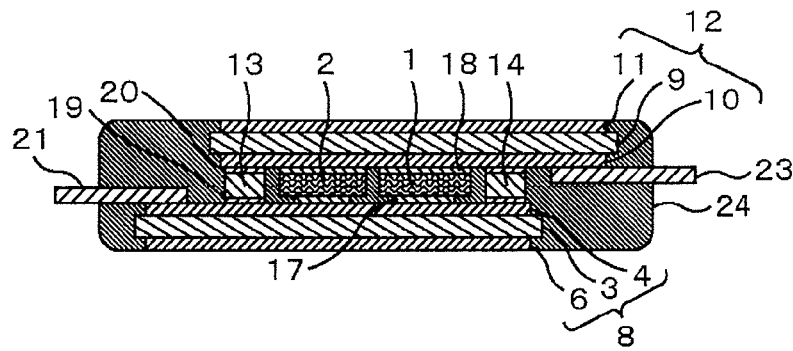
FIGS. 1A-1D show an embodiment of a power semiconductor module according to the present invention.
Figure 1B:
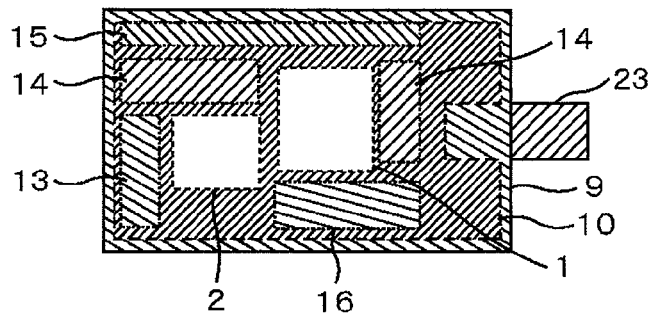
Figure 1C:
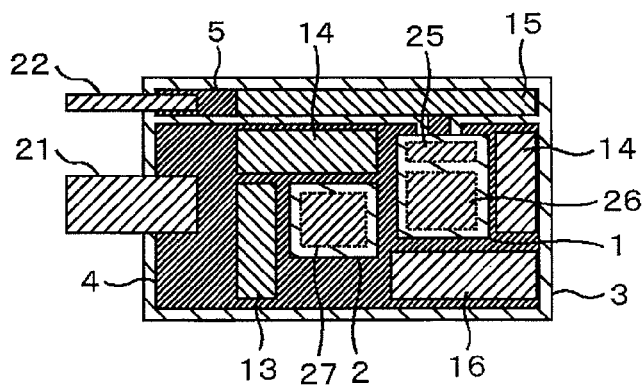
Figure 1D:
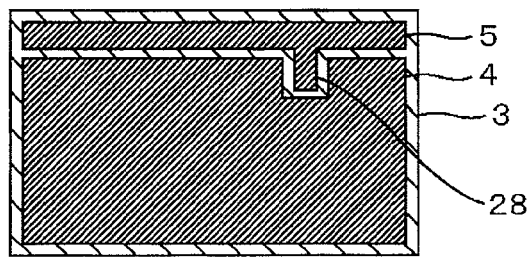
Figure 2:
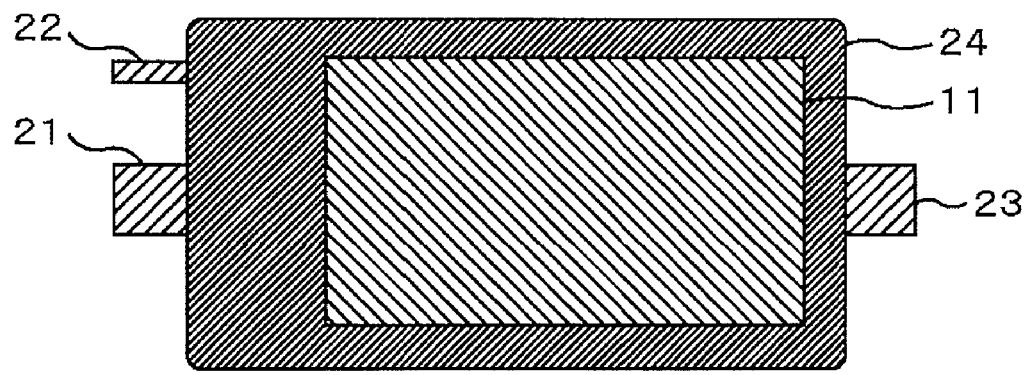
FIG. 2 is a top view of the power semiconductor module shown in FIGS. 1A-1D.
Figure 3:
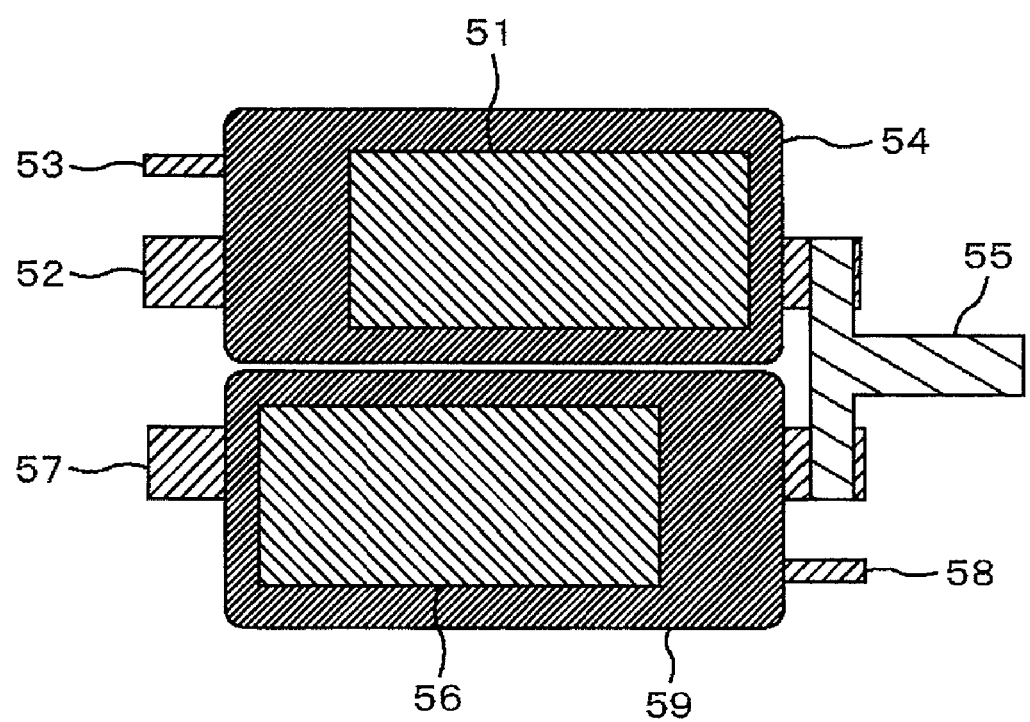
FIG. 3 shows a configuration example of an inverter apparatus corresponding to one phase obtained by assembling the power semiconductor modules shown in FIGS. 1A-1D.

FIGS. 1A-1D show an embodiment of a power semiconductor module according to the present invention including one power transistor device and one diode device. FIG. 1A is a sectional view of the module. FIG. 1B is a perspective view of a metal electrode of a device side face on an upper ceramic substrate with printed circuit. FIG. 1C is a top view obtained when an upper substrate with printed circuit and resin are removed. FIG. 1D is a top view of a lower substrate with printed circuit. In FIGS. 1A-1D, an IGBT chip 1 and a diode chip 2 are joined onto a ceramic substrate with printed circuit 8 having metal electrodes 4, 5 and 6 of Cu formed above and below a low thermal expansion ceramic substrate 3 with printed circuit, by high temperature solder 17 having a temperature at solidus line of at least 260° C. formed of SnSbAgCu. The sectional view of FIG. 1A shows the metal electrodes 4 and 6 of the printed circuit 8, while the top views of FIGS. 1C and 1D show the metal electrodes 4 and 5 of the printed circuit 8, with the metal electrode 5 being located adjacent the metal electrode 4. Electroless Ni—P plating having a thickness of approximately 5 μm is performed on surfaces of the metal electrode 4, 5 and 6 on ceramic substrates with printed circuit. Similar electroless Ni—P plating is performed on the surface of an Al electrode of each chip as well. A structure in which electroless Ni—P platings are joined to each other by an alloy of Sn-35Sb-11Ag-9Au is formed. Upper electrodes of these chips are joined to a metal electrode 10 formed of Cu on an upper low thermal expansion ceramic substrate 9 via a Ti/Ni layer by high temperature solder formed of SnSbAgCu similar to that of the lower substrate with printed circuit. Electroless Ni—P plating is performed on the metal electrode on ceramic substrate with printed circuit in the same way as the lower substrate with printed circuit. Insulating inorganic materials 13, 14, 15 and 16 formed of $Si_3N_4$ ceramics and metallized on upper and lower faces with Ti/Ni are disposed around each chip so as to fill the space between the ceramic substrates with printed circuit 8 and 12, and joined to the metal electrodes on ceramic substrate with printed circuit with SnSbAgCu high temperature solder which is the same as the joining material of each chip. The $Si_3N_4$ ceramics has a coefficient of thermal expansion of approximately 3 ppm/K, which is substantially equal to the coefficient of thermal expansion of the IGBT and the diode chip. Metal leads (input terminal, control signal terminal and output terminal) 21, 22 and 23 formed of Cu are joined to metal electrodes on the upper and lower ceramic substrates with printed circuit as external input and output terminals. A thermo setting mold resin mixed with a low thermal expansion inorganic filler at a high ratio so as to have a coefficient of thermal expansion of 10 ppm/K or less is formed with a part of the metal lead and faces of metal electrodes 6 and 11 on ceramic with printed circuit outside the ceramic substrates with printed circuit in an exposed state. Electrodes of the IGBT chip on the circuit side are formed of a main electrode 26 and a control electrode 25, and respective electrodes are joined to the insulated and isolated metal electrodes 4 and 5 on the ceramic substrate with printed circuit. FIG. 2 is a diagram obtained by viewing the power semiconductor module shown in FIGS. 1A-1D from above. The power semiconductor module is formed so as to expose the metal electrode 11 on ceramic substrate with printed circuit subjected to electroless Ni—P plating to the surface of the top face molded with resin and protrude the input terminal 21, the control signal terminal 22 and the output terminal 23 from the resin. FIG. 3 shows an inverter configuration formed by combining two power semiconductor modules shown in FIG. 2 to convert a direct current to a varying waveform. If two sets of this configuration are prepared, an inverter apparatus for converting a DC current to an AC current is obtained.

According to the present embodiment, the ceramic substrates with printed circuit are disposed above and below the power semiconductor device so as to cause the coefficient of thermal expansion in the constituent materials to be vertically symmetrical. Accordingly, great warp deformation is not generated. Compression or tensile force acted between the ceramic substrates with printed circuit can be scattered outside the device and the joining part, by disposing inorganic materials having a coefficient of thermal expansion equal to that of the device, around the device. As a result, thermal stress generated in the joining part of the device when the module has changed from a low temperature to a high temperature can be reduced. The thermal fatigue life can be prolonged remarkably, and heat resistance at the time when the device is exposed to a temperature exceeding 200° C. is obtained. Since the Sn-35Sb-11Ag-9Cu alloy is used as the joining material and Ni or electroless Ni—P is used as the metallized configuration of the joined face, it is possible to provide a power semiconductor module in which the suppression of the compound growth and a strength fall at high temperatures can be prevented and the joining part is not degraded in strength even if the module is exposed to high temperatures over a long time, resulting in excellent reliability at high temperatures. Note that while the insulating inorganic materials formed of $Si_3N_4$ are used in the embodiment of FIG. 1, any insulating materials having a coefficient of thermal expansion in a range of 2 to 6 ppm can be used and AlN ceramics and composite ceramic materials, for example, provide the same effects.

Figure 4A:
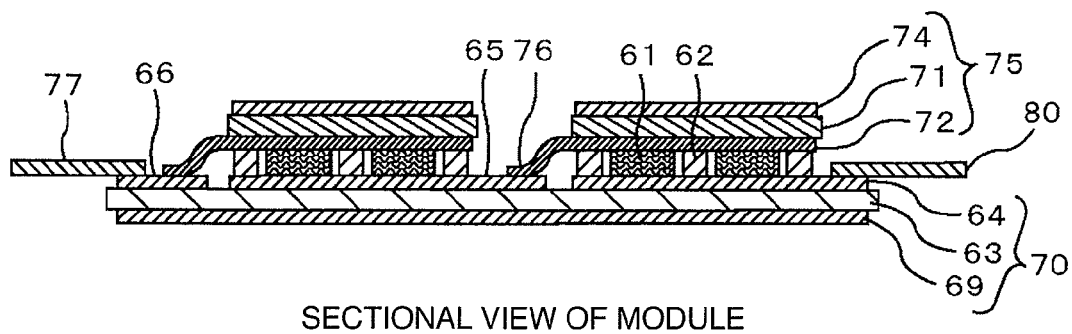
FIGS. 4A-4B show another embodiment of a power semiconductor module according to the present invention.
Figure 4B:
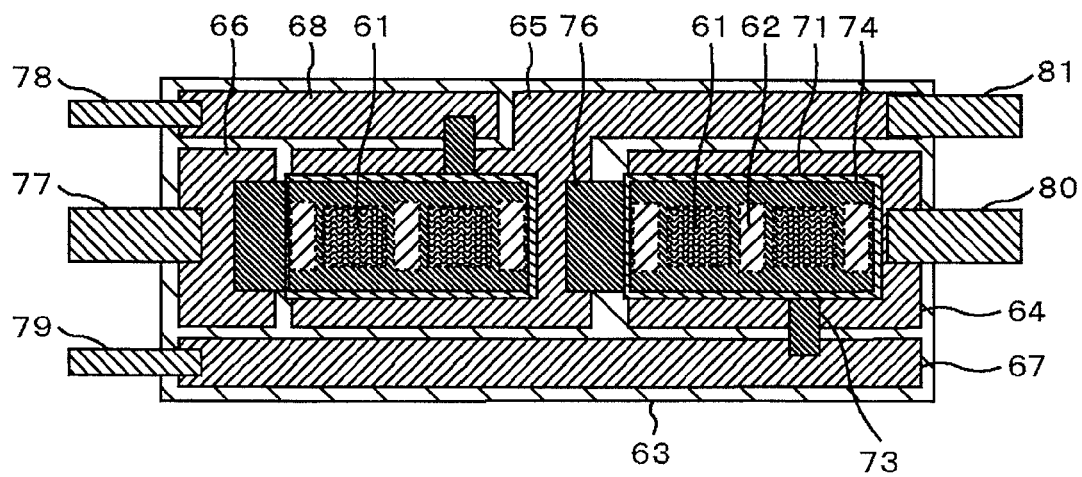

FIGS. 4A and 4B show another embodiment of the power semiconductor module according to the present invention in which an upper electric connection conductor of the power semiconductor module is made the same in constituent material as the lower ceramic substrate with printed circuit. FIG. 4A is a sectional view of the power semiconductor module. FIG. 4B is a top view obtained when mold resin is removed from the module. In FIGS. 4A and 4B, metal electrodes 64, 65, 66, 67, 68 and 69 are formed of Al on both sides of a low thermal expansion ceramic substrate 63 of AlN, and electroless Ni—P plating is performed on the surface thereof. One pair of the IGBT chip and the diode chip are joined and mounted on each of the metal electrodes 64 and 65, and an inorganic material 62 of $Si_3N_4$ is disposed, joined and mounted so as to have each chip between. Thereon, a ceramic substrate with printed circuit 75 having a small dimension covering one pair of chips and the inorganic material is disposed. The chips and the inorganic material are joined to a metal electrode 72 on the substrate 75 with printed circuit. A lower metal electrode on the ceramic substrate 75 with printed circuit on the chips is connected to a metal electrode on the lower ceramic substrate 70 with printed circuit by conductor materials 73 and 76 formed so as to protrude from a ceramic substrate 71 with printed circuit. Furthermore, metal leads 77, 78, 79, 80 and 81 serving as external input and output terminals are joined to metal electrodes on the lower substrate with printed circuit. Thermo setting mold resin adjusted to have a coefficient of thermal expansion of 10 ppm/K or less is formed on one side of the lower ceramic substrate with printed circuit up to a height that slightly covers the upper ceramic substrate with printed circuit.

According to the present embodiment, low thermal expansion ceramic substrates with printed circuit adjusted to have substantially the same coefficient of thermal expansion are disposed above and below the device. Therefore, warp deformation does not occur in a region where the device exists. Since the substrates with printed circuit themselves are also low in thermal expansion, large thermal stress does not occur in the joining part of the device. As a result, a highly reliable power semiconductor module can be provided. Furthermore, since not only the device but also the low expansion inorganic material joins and reinforces the upper and lower ceramic substrates with printed circuit so as to unite them into one body. Therefore, it becomes possible to prevent all of the pushing pressure or tensile force generated when the resin expands from being applied to the joining part of the device. This brings about an effect that the joining part or the device can be prevented from being damaged. There is a partial region where the ceramic substrates with printed circuit and the resin become asymmetric vertically. However, the mold thickness of the resin can be made as thin as the thickness of the device and the upper ceramic substrate with printed circuit. As a result, the warp deformation of the whole module can be made small. In the case of a mounting structure in which a cooling substance is adhered closely to the lower ceramic substrate with printed circuit to conduct cooling, the gap between them can be made narrow, resulting in an advantage that remarkable falling of the cooling performance can be prevented.

Figure 5:
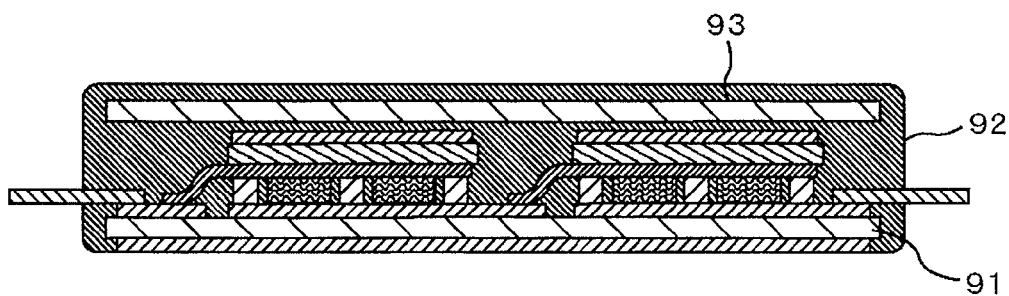
FIG. 5 shows another embodiment of a power semiconductor module according to the present invention.

FIG. 5 shows a section structure of a power semiconductor module obtained from the power semiconductor module structure shown in FIGS. 4A and 4B by disposing a low thermal expansion ceramic substrate that is equivalent in dimension to the lower ceramic substrate with printed circuit over the upper ceramic substrate with printed circuit and molding them with resin. In FIG. 5, a power semiconductor device and a low thermal expansion inorganic material are joined and mounted on a ceramic substrate with printed circuit 91 formed of an AlN ceramic substrate and Al metal electrodes on ceramic substrate with printed circuit. Thereon, a ceramic substrate with printed circuit for electrical connection having small dimensions is joined and mounted. Over it, an AlN substrate 93 is disposed with a gap. A mold resin 92 is formed so as to cover the ceramic substrate with printed circuit.

According to the present embodiment, a structure that is vertically symmetrical in coefficient of thermal expansion can be obtained by disposing a low thermal expansion ceramic substrate with printed circuit on the upper side of the module. It is thus possible to provide a highly reliable power semiconductor module by preventing warp deformation in the power semiconductor module and preventing falling of the cooling performance and falling of the thermal fatigue life in the joining part. The present embodiment has a structure in which the low thermal expansion ceramic substrate is buried in the mold resin. Alternatively, a structure in which one side of the ceramic substrate is exposed from the mold resin to the outside or a structure in which the ceramic substrate is glued onto the mold resin may also be used.

Figure 6:
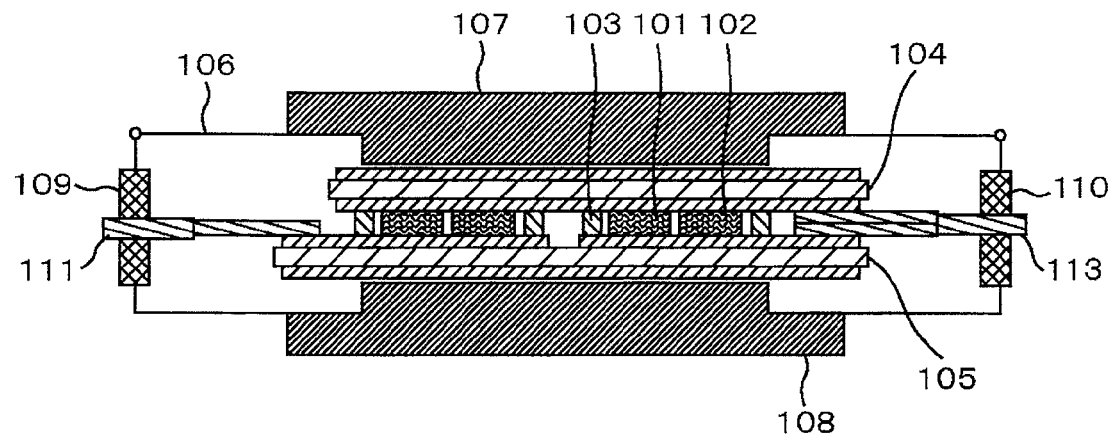
FIG. 6 shows another embodiment of a power semiconductor module according to the present invention.
Figure 7A:
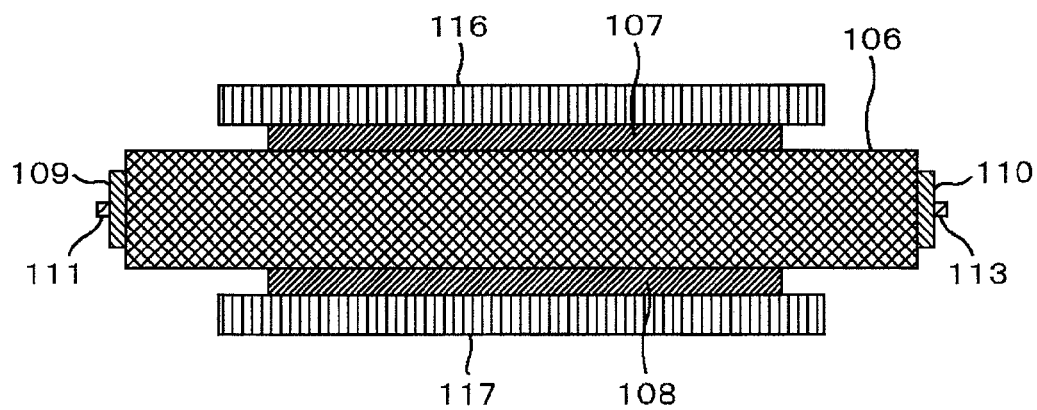
FIGS. 7A-7B show an embodiment of mounting of the power semiconductor module shown in FIG. 6.
Figure 7B:
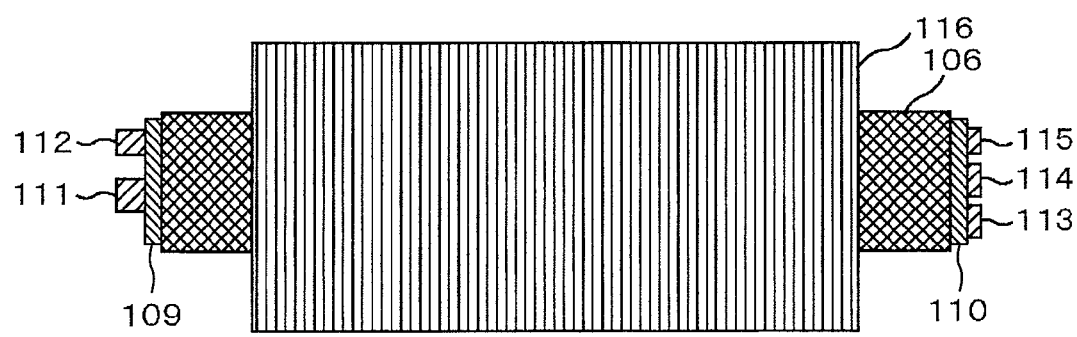

FIG. 6 shows another embodiment of a power semiconductor module according to the present invention formed without using a resin having a low coefficient of thermal expansion as a constituent material. In FIG. 6, ceramic substrates with printed circuit board 104 and 105 are joined and disposed so as to have power semiconductor devices 101 and 102 between, and a low thermal expansion inorganic material 103 is disposed around the devices, and joined and fixed to the upper and lower ceramic substrates with printed circuit. The joined substances are sealed into a sealed capsule 106 having high thermal conductive materials 107 and 108 above and below it. A plurality of input and output terminals 111 and 113 insulated electrically from the sealed capsule by ceramic materials 109 and 110 are installed in the sealed capsule. Insulating gas such as $SF_6$ or a high boiling point insulating liquid is sealed in the sealed capsule. FIGS. 7A and 7B are diagrams showing a state in which the semiconductor module shown in FIG. 6 is pressurized by cooling plates and mounted. In FIGS. 7A and 7B, a plurality of electric input and output terminals 111, 112, 113, 114 and 115 are formed so as to be protruded from the sealed capsule to the left and side and insulated by ceramic materials. The sealed capsule is sandwiched between cooling plates 116 and 117 and subjected to pushing pressure, and the internal joined substances are sandwiched between high thermal conductive materials 107 and 108. A plurality of semiconductor modules can be mounted in a package by stacking semiconductor modules each shown in FIG. 6 one on another with a high thermal conductive plate inserted therebetween and disposing high thermal conductive members on the top and bottom ends of the stack and by applying a pushing pressure thereon to thereby form the packaged structure.

According to the present embodiment, all constituent materials are inorganic materials. Therefore, the heat resistance of the module can be raised to at least 250° C., and a high heat-resistant power semiconductor module can be provided. Furthermore, even if the external cooling substances are pushed against with strong force, the inorganic material disposed around the devices supports the pressure. As a result, the devices can be prevented from being damaged. Furthermore, since the joined substance of the power semiconductor module and the metal material of the sealed capsule are not joined, the module is not damaged by thermal strain generated by a difference between them in coefficient of thermal expansion. Thus, it is possible to provide a highly reliable power semiconductor module that can be used up to a high temperature region of at least 250° C. Further, by virtue of a packaged structure formed by stacking a plurality of semiconductor modules, it becomes possible to provide a semiconductor module that is of small size but has a large capacity.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A power semiconductor module comprising:
a power semiconductor device having a main electrode and a control electrode formed on a circuit face and a rear electrode formed on a face opposite to the circuit face;
a ceramic substrate with printed circuit having metal electrodes formed on both faces of the ceramic substrate, the metal electrode being joined to the rear electrode of the power semiconductor device;
a lead having metal electrodes formed on both faces of a ceramic substrate, the metal electrode being joined to the main electrode and the control electrode of the power semiconductor device; and
a mold resin having a coefficient of thermal expansion of 10 ppm/K or less for sealing the ceramic substrate with printed circuit, the power semiconductor device and the lead so as to expose metal electrodes on a side of the ceramic substrate with printed circuit that is not joined to the power semiconductor device and metal electrodes on a side of the lead that is not joined to the power semiconductor device to outside.

2. The power semiconductor module according to claim 1, wherein an insulating material having a coefficient of thermal expansion in a range of 2 to 6 ppm/K is disposed between the ceramic substrate with printed circuit and the lead.

3. The power semiconductor module according to claim 2, wherein
a metal layer is formed on a face of the insulating material opposed to the ceramic substrate with printed circuit, and on a face of the insulating material opposed to the lead, and
the metal layer is joined to the ceramic substrate with printed circuit and the lead by a solder material.

4. The power semiconductor module according to claim 2, wherein the insulating material is substantially equal in thickness to the power semiconductor device.

5. The power semiconductor module according to claim 1, wherein the substrate with printed circuit and the rear electrode, and the lead and the main electrode and the control electrode have a yield strength higher than that of a material of the metal electrodes, and joined by a solder material having a melting point of at least 260° C.

6. The power semiconductor module according to claim 5, wherein the solder material is SnSbAgCu solder.

7. The power semiconductor module according to claim 1, wherein the ceramic substrate included in the substrate with printed circuit and the lead is $Si_3N_4$.

8. The power semiconductor module according to claim 1, wherein a ceramic substrate that is equal in dimensions to the ceramic substrate with printed circuit is buried in the mold resin or adhered onto the mold resin.

9. A power semiconductor module comprising:
a ceramic substrate with printed circuit having metal electrodes formed on both faces of a ceramic substrate;
at least one power semiconductor device;
an insulating inorganic material having a coefficient of thermal expansion in a range of 2 to 6 ppm/K; and
a mold resin material having a coefficient of thermal expansion of 10 ppm/K or less,
wherein
the ceramic substrate with printed circuit is disposed on each of above and below the device,
electrodes located above and below the device are joined to the upper and lower metal electrodes on ceramic substrates with printed circuit with an alloy phase having a temperature at solidus line of at least 260° C.,
the inorganic material is disposed around the semiconductor device, and
a space between the ceramic substrates with printed circuit is filled with the mold resin material.

10. The power semiconductor module according to claim 9, wherein
a low thermal expansion metal material having a coefficient of thermal expansion of 10 ppm/K or less is joined to a main electrode and a control electrode on a circuit face side of the power semiconductor device, and
the device and the ceramic substrate with printed circuit are joined respectively to the low thermal expansion metal material and the other ceramic substrate with printed circuit with an alloy layer having a mechanical characteristic that is higher than a yield strength of a material of the metal electrode.

11. The power semiconductor module according to claim 9, wherein upper constituent materials and lower constituent materials constitute a structure that is substantially symmetrical about the power semiconductor device.

12. A power semiconductor module comprising:
a ceramic substrate with printed circuit having metal electrodes formed on both faces of a ceramic substrate;
at least one power semiconductor device;
an insulating inorganic material having a coefficient of thermal expansion in a range of 2 to 6 ppm/K;
a sealed capsule comprising a plurality of electric input and output parts electrically isolated by the insulating inorganic material; and
an insulating gaseous or liquid coolant,
wherein
the ceramic substrate with printed circuit is disposed on each of above and below the power semiconductor device,
electrodes are joined to the metal electrodes on ceramic substrates with printed circuit with an alloy layer having a melting point of at least 260° C.,
the inorganic material is disposed around the semiconductor device,
those constituent materials are incorporated in the sealed capsule,
inside of the sealed capsule is filled with the coolant, and
the metal electrodes on ceramic substrates with printed circuit are electrically connected to the electric input and output parts.

13. The power semiconductor module according to claim 12, wherein a constituent material of the sealed capsule located above and below the ceramic substrates with printed circuit is formed of a metal plate including Cu or Al having a thickness of at least 1 mm as a main constituent element.

14. An inverter apparatus constructed by stacking the power semiconductor modules according to claim 12 with a high thermal conductive plate between and applying pushing pressure to the power semiconductor modules via high thermal conductive plates located at top and bottom ends.

15. The inverter apparatus according to claim 14, wherein a high thermal conductive material having a low yield strain is disposed between the high thermal conductive plate and the power semiconductor module.

* * * * *